US006979159B2

(12) United States Patent
Chen

(10) Patent No.: US 6,979,159 B2
(45) Date of Patent: Dec. 27, 2005

(54) ASSEMBLY OF A CIRCUIT BOARD WITH A NUT

(75) Inventor: Wei-Chen Chen, Hsin-Tien (TW)

(73) Assignee: EMI Stop Corp., Taipei-Hsien (TW)

(*) Notice: Subject to any disclaimer, the term of this patent is extended or adjusted under 35 U.S.C. 154(b) by 22 days.

(21) Appl. No.: 10/300,221

(22) Filed: Nov. 20, 2002

(65) Prior Publication Data

US 2003/0099524 A1 May 29, 2003

(30) Foreign Application Priority Data

Nov. 27, 2001 (TW) .............................. 90220490 U

(51) Int. Cl.[7] ................................................ F16B 37/06
(52) U.S. Cl. ........................ 411/171; 411/172; 411/427
(58) Field of Search ........................ 411/171, 172, 179, 411/180, 82, 930, 258, 427

(56) References Cited

U.S. PATENT DOCUMENTS 4,523,883 A * 6/1985 Peterson et al. ............ 411/171
5,539,416 A * 7/1996 Castaneda et al. .......... 343/702
5,667,328 A * 9/1997 Hofle ......................... 403/282
5,673,927 A * 10/1997 Vermillion .................. 280/611
5,823,729 A * 10/1998 Nagayama .................. 411/429
6,174,173 B1 1/2001 Fukunaga
6,213,578 B1 * 4/2001 LaGrotta et al. ............ 312/351
6,485,240 B2 * 11/2002 Stumpf et al. .............. 411/171

FOREIGN PATENT DOCUMENTS

CN 2311651 Y 3/1999
WO WO 88/07808 A1 10/1988

OTHER PUBLICATIONS

Search Report dated Sep. 9, 2004.

* cited by examiner

*Primary Examiner*—William L. Miller
(74) *Attorney, Agent, or Firm*—Darby & Darby

(57) ABSTRACT

A nut includes a bottom wall adapted to be connected fixedly to a printed circuit board, and an annular surrounding wall extending integrally from a periphery of the bottom wall away from the printed circuit board, having a threaded inner wall surface, and cooperating with the bottom wall to define a threaded blind hole for engagement with a bolt.

2 Claims, 2 Drawing Sheets

ASSEMBLY OF A CIRCUIT BOARD WITH A NUT

CROSS-REFERENCE TO RELATED APPLICATION

This application claims priority of Taiwanese Application No. 090220490, filed on Nov. 27, 2001.

BACKGROUND OF THE INVENTION

1. Field of the Invention

The invention relates to a nut, more particularly to a nut with a threaded blind hole for use on a printed circuit board.

2. Description of the Related Art

Currently, to solder circuit-related components on a printed circuit board (PCB), each component is sucked by a suction nozzle first, and is then released to a predetermined position on the PCB. After all the components are mounted on the PCB, the latter is heated by passing through a soldering furnace, thereby soldering all components on the PCB.

Referring to FIG. 1, a conventional nut 3 includes an annular surrounding wall 31 and a through hole 32 defined by the annular surrounding wall 31. Since a suction nozzle 5 cannot apply a negative pressure to the nut 3 due to the presence of the through hole 32, a soft top plug 33 has to be mounted on a top surface 34 of the nut 3. The top plug 33 includes a head portion 332, and a shank portion 331 that extends into the through hole 32 and that has an outside diameter slightly larger than the inner diameter of the through hole 32 such that the shank portion 331 forms an air-tight seal with the through hole 32, thereby sealing the through hole 32.

During assembly, the suction nozzle 5 applies a negative pressure to the head portion 332 of the plug 33 so as to hold the nut 3, and subsequently releases the nut 3 to a predetermined position on the PCB 4. The PCB 4 is then passed through a soldering furnace (not shown) so that the nut 3 and the other components are soldered on the PCB 4. The plug 33 is removed after assembly. When an automated arm (not shown) is used to remove the plug 33 from the nut 3, it is likely that the connection between the nut 3 and the circuit board 4 is damaged. As such, manual removal is needed.

Referring to FIG. 2, a cap 33' can be mounted on the top surface of the nut 3 instead of the plug 33 (see FIG. 1) to cover the through hole 32. The cap 33' has a clamp portion 331' with an inner diameter slightly smaller than the outer diameter of the nut 3, such that the clamp portion 331' can be sleeved tightly on the surrounding wall 31 of the nut 3. The cap 3' is also manually removed from the nut 3 after the nut 3 is soldered on the PCB 4.

Since the through hole 32 in the conventional nut 3 has to be covered by the plug 331 or the cap 331' before soldering on the PCB 4, and since the plug 331 or the cap 331' has to be manually removed after soldering on the PCB 4, the assembly steps and the assembly cost for mounting the conventional nut 3 on the PCB 4 are increased.

SUMMARY OF THE INVENTION

Therefore, the main object of the present invention is to provide a nut that is capable of overcoming the aforementioned drawbacks of the prior art.

According to one aspect of the present invention, a nut is adapted for use on a printed circuit board, and comprises a bottom wall and an annular surrounding wall. The bottom wall is adapted to be connected fixedly to the printed circuit board. The annular surrounding wall extends integrally from a periphery of the bottom wall away from the printed circuit board, has a threaded inner wall surface, and cooperates with the bottom wall to define a threaded blind hole for engagement with a bolt.

According to another aspect of the present invention, a nut is adapted for use on a printed circuit board, which is formed with a positioning hole. The nut comprises a bottom wall and an annular surrounding wall. The bottom wall has a bottom surface that is adapted to abut against the printed circuit board and that is formed with a tongue, which extends integrally from the bottom surface and which is adapted to be received fittingly and fixedly within the positioning hole in the printed circuit board. The annular surrounding wall extends integrally from a periphery of the bottom wall away from the printed circuit board, has a threaded inner wall surface, and cooperates with the bottom wall to define a threaded blind hole for engagement with a bolt.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
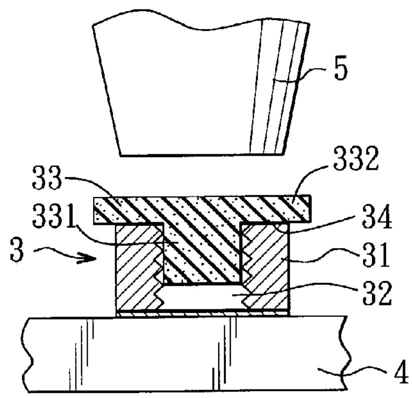
FIG. 1 is a sectional view illustrating how a conventional nut is assembled on a printed circuit board using a suction nozzle and a plug.
Figure 2:
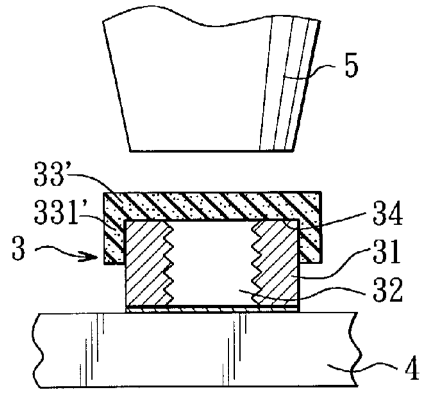
FIG. 2 is a sectional view illustrating how the conventional nut is assembled on the printed circuit board using the suction nozzle and a cap.

Before the present invention is described in greater detail, it should be noted that like elements are denoted by the same reference numerals throughout the disclosure.

Figure 3:
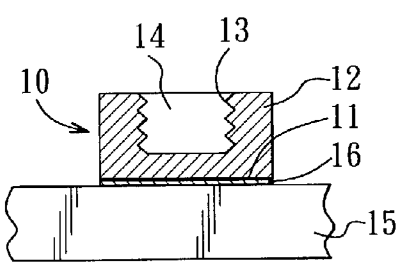
FIG. 3 is a sectional view of the first preferred embodiment of a nut according to the present invention, illustrating the nut assembled on a printed circuit board.

Referring to FIG. 3, the first preferred embodiment of a nut 10 according to the present invention is adapted to be used on a printed circuit board (PCB) 15, and is shown to comprise a bottom wall 11 and an annular surrounding wall 12. The bottom wall 11 is adapted to be connected fixedly to a connecting piece 16 of the printed circuit board 15. The annular surrounding wall 12 extends integrally from a periphery of the bottom wall 11 away from the printed circuit board 15, has a threaded inner wall surface 13, and cooperates with the bottom wall 11 to define a threaded blind hole 14 for engagement with a bolt (not shown).

During assembly, because the nut 10 of the present invention has a blind hole 14, the automated suction nozzle (not shown) can directly apply a negative pressure to the nut 10, thereby holding the nut 10, and afterwards release the nut 10 to a predetermined position on the printed circuit board 15. The printed circuit board 15 is then heated by passing through a soldering furnace (not shown), which solders the nut 10 on the printed circuit board 15.

Figure 4:
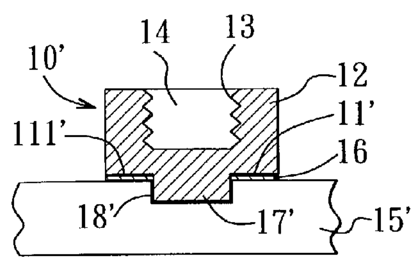
FIG. 4 is a sectional view of the second preferred embodiment of a nut according to the present invention, illustrating the nut assembled on a printed circuit board.

Referring to FIG. 4, the second preferred embodiment of a nut 10' according to the present invention is shown to be substantially similar to the first preferred embodiment. This embodiment is suitable for use on a printed circuit board 15', which is formed with a positioning hole 18'. The bottom wall 11' of the nut 10' has a bottom surface 111' that is adapted to abut against the connecting piece 16' of the printed circuit board 15' and that is formed with a tongue 17'. The tongue 17' extends integrally from the bottom surface 111' of the bottom wall 11', and is adapted to be received fittingly and fixedly within the positioning hole 18' in the printed circuit board 15'. Assembly of the second preferred embodiment is conducted in a manner substantially similar to that of the first preferred embodiment.

Therefore, the nuts 10, 10' (see FIGS. 3 and 4) of the present invention can be easily mounted on the printed circuit board 15, 15' (see FIGS. 3 and 4), thereby simplifying the production process and reducing assembly costs.

Figure 5:
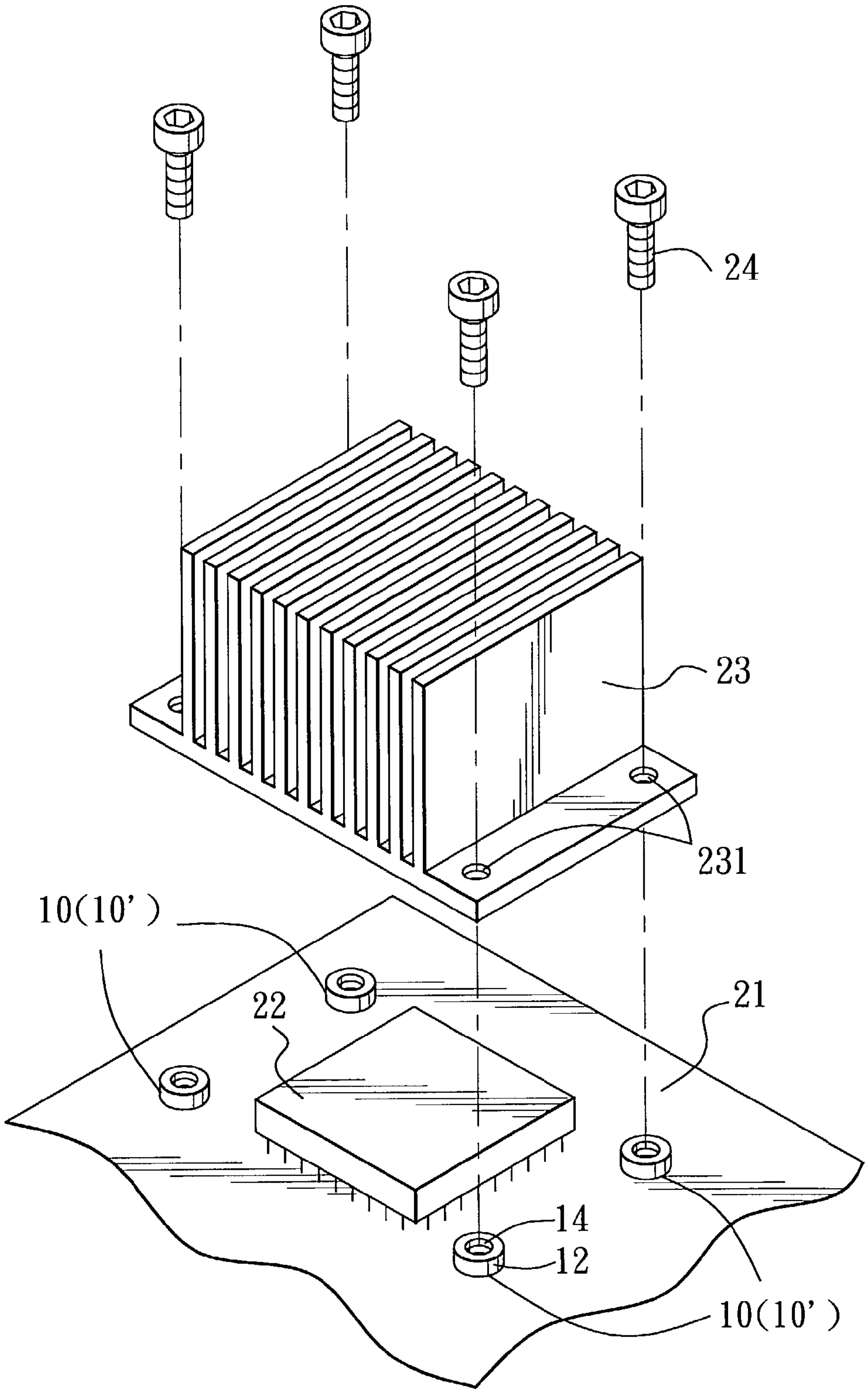
FIG. 5 is a perspective view illustrating the nuts of the present invention in a state of use.

FIG. 5 is a drawing to illustrate the application of the nuts 10, 10' of the present invention. The printed circuit board, in this drawing, is a mother board 21. A central processing unit 22 is mounted on the mother board 21. After four nuts 10, 10' of the present invention are soldered to the mother board 21 using the above-mentioned assembly method, a heat sink 23 can be mounted securely on top of the central processing unit 22 by using four bolts 24, each of which extends through a respective through hole 231 in the heat sink 23, and engages the threaded blind hole 14 in a respective one of the nuts 10, 10'.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. An assembly comprising a circuit board and a nut, said nut assembly comprising:

a bottom wall soldered to said circuit board; and an annular surrounding wall extending integrally from a periphery of said bottom wall away from said circuit board, said surrounding wall having a threaded inner wall surface and cooperating with said bottom wall to define a threaded blind hole for engagement with a bolt;

said circuit board being formed with a positioning hole; and said bottom wall having a bottom surface that abuts against said circuit board and that is formed with a tongue, which extends integrally from said bottom surface and which is fixed within said positioning hole in said circuit board.

2. The assembly as set forth in claim 1, wherein said positioning hole in said circuit board is blind.

* * * * *